United States Patent
Tu

(10) Patent No.: US 9,431,086 B2
(45) Date of Patent: Aug. 30, 2016

(54) MEMORY CIRCUIT AND REFRESH METHOD THEREOF

(71) Applicant: Windbond Electronics Corp., Taichung (TW)

(72) Inventor: Ying-Te Tu, Kaohsiung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/507,476

(22) Filed: Oct. 6, 2014

(65) Prior Publication Data

US 2016/0099043 A1 Apr. 7, 2016

(51) Int. Cl.
*G11C 7/00* (2006.01)
*G11C 11/406* (2006.01)

(52) U.S. Cl.
CPC .............................. *G11C 11/40615* (2013.01)

(58) Field of Classification Search
CPC ................................................ G11C 11/40615

USPC .................................... 365/222, 230.03, 236
See application file for complete search history.

(56) References Cited

U.S. PATENT DOCUMENTS

| | | | |
|---|---|---|---|
| 2014/0006704 A1 | 1/2014 | Greenfield et al. | |
| 2014/0085995 A1* | 3/2014 | Greenfield | G11C 7/24 365/201 |
| 2014/0156923 A1* | 6/2014 | Bains | G11C 11/4078 711/106 |

* cited by examiner

*Primary Examiner* — Hoai V Ho
(74) *Attorney, Agent, or Firm* — Muncy, Geissler, Olds & Lowe, P.C.

(57) ABSTRACT

A memory circuit is provided. The memory circuit includes a memory array, a plurality of word lines and a memory controller. The memory array has a plurality of memory blocks. The memory controller outputs an access instruction and an access address to address the word lines for accessing the memory array, or the memory controller outputs a refresh instruction and a refresh address to address the word lines for refreshing the memory array, wherein the memory controller performs a refresh operation on each of the memory blocks corresponding to each of the word lines at predetermined intervals. The memory controller counts the number of times the access instructions have been output and determines whether that number equals a predetermined value or not. According to the determination result, the memory controller selects an address adjacent to the access address as the refresh address for the next refresh operation.

7 Claims, 3 Drawing Sheets the subsequent detailed description and examples
MEMORY CIRCUIT AND REFRESH METHOD THEREOF

TECHNICAL FIELD

The disclosure relates to a memory circuit, and more particularly to a refresh method for the memory circuit.

BACKGROUND

In the memory products, after a word line $WL_n$ has been cumulatively accessed (for example, after having been accessed 5000 times), the word line $WL_{(n-1)}$ adjacent to the word line $WL_n$ will have been disturbed. This causes the stored data of the word line $WL_{(n-1)}$ to becomes damaged (such as a cell leak). This phenomenon is called row hammer. For example, assuming each word line in the memory product is refreshed every 32 ms and the duty cycle of the memory product is 80 μs. In general manufacturing procedure, the stored data of the word line will be damaged if the number of times a disturbance occurs exceeds $10^5$ times (or $2*10^5$ times). If the word line $WL_n$ in a memory product has been incessantly accessed every 32 ms, then the victim word line $WL_{(n-1)}$ adjacent to the word line $WL_n$ has been disturbed $4*10^5$ times (32 ms/80 μs). This will lead to a row hammer occurring on the victim word line $WL_{(n-1)}$. Therefore the present disclosure provides a memory circuit and a related refresh method to resolve the problem described above.

SUMMARY

An embodiment of the present disclosure provides a memory circuit. The memory circuit comprises a memory array, a plurality of word lines and a memory controller. The memory array has a plurality of memory blocks. Each of the memory blocks has a corresponding word line. The memory controller outputs an access instruction and an access address to address the word lines for accessing the memory array, or it outputs a refresh instruction and a refresh address to address the word lines for refreshing the memory array, wherein the memory controller performs a refresh operation on each of the memory blocks corresponding to each of the word lines at predetermined intervals. The memory controller counts the number of times the access instructions have been output and determines whether it equals a predetermined value or not. According to the determination result, the memory controller selects an address adjacent to the access address as the refresh address for the next refresh operation.

An embodiment of the present disclosure provides a memory circuit refresh method for refreshing a plurality of memory blocks of a memory array. Each of the memory blocks has a corresponding word line. The refresh method comprising: receiving an instruction input; determining whether the instruction input is an access instruction or a refresh instruction; outputting the access instruction and an access address to address the word lines for accessing the memory array, or outputting a refresh instruction and a refresh address to address the word lines for refreshing each of the memory blocks corresponding to each of the word lines; counting the number of times the access instructions have been output and determining whether this equals a predetermined value or not; and determining, according to the determination result, whether to select an address adjacent to the access address as the refresh address for the next refresh operation or not.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Figure 1A:
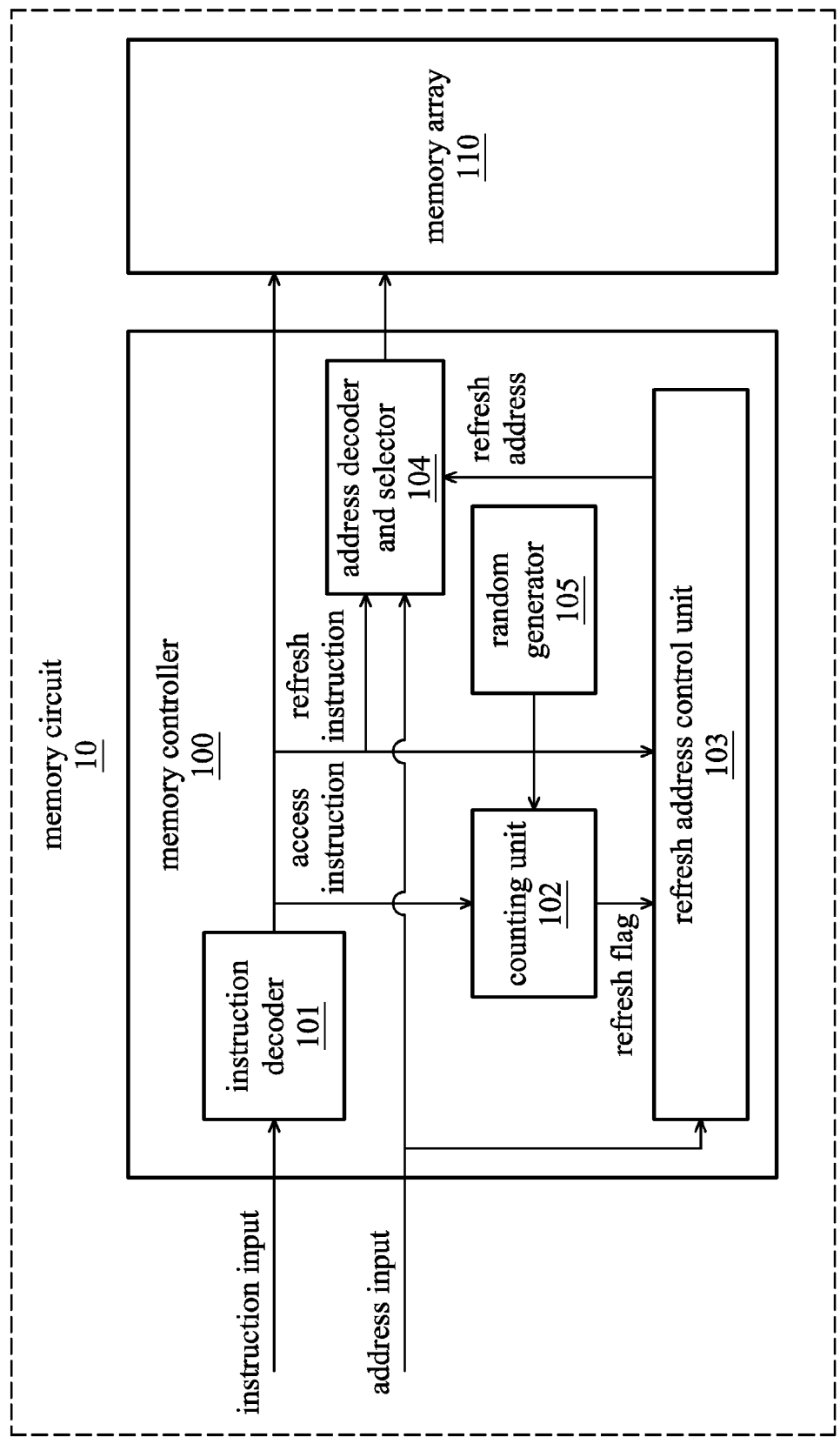
FIG. 1A shows a block diagram of a memory circuit 10 according to the first embodiment of the present disclosure.

FIG. 1A shows a block diagram of a memory circuit 10 according to the first embodiment of the present disclosure. In the first embodiment, the memory circuit 10 comprises a memory controller 100 and a memory array 110. The memory controller 100 comprises an instruction decoder 101, a counting unit 102, a refresh address control unit 103, an address decoder and selector 104 and a random generator 105. The memory array 110 has a plurality of memory blocks, wherein each of the memory blocks has a corresponding word line. The memory controller 100 receives an instruction input and an address input and outputs an access instruction and an access address to address the plurality of word lines to access the memory array 110, wherein the address input is an access address which is used to address the plurality of word lines. In the first embodiment, the memory controller 100 outputs a refresh instruction and a refresh address to address the plurality of word lines to access the memory array 110 in each predetermined interval.

In the first embodiment, the instruction decoder 101 receives the instruction input and determines whether the instruction input is an access instruction or a refresh instruction. Then the instruction decoder 101 outputs the access instruction or the refresh instruction. The counting unit 102 is used to count the number of times the access instructions have been output. When the number of times the access instructions have been output equals a predetermined value, the counting unit 102 outputs a refresh flag to the refresh address control unit 103 and resets the number of times the access instructions have been output. The random generator 105 is coupled to the counting unit 102 and used to generate a random value to refresh the above predetermined value.

The refresh address control unit 103 is coupled to the counting unit 102. The refresh address control unit 103 receives the access address, the refresh flag and the refresh instruction and outputs the refresh address. In the first embodiment, the refresh address control unit 103 selects an automatic refresh address generated internally as the refresh address. When the refresh address control unit 103 receives the refresh flag, the refresh address control unit 103 stops selecting the automatic refresh address as the refresh address and selects the address adjacent to the access address as the refresh address for the next refresh operation.

In the first embodiment, the address decoder and selector 104 is coupled to the refresh address control unit 103. The address decoder and selector 104 receives the address input (the access address), the refresh instruction and the refresh address. The access address is used to address a word line for accessing the memory block corresponding to the word line. Similarly, the refresh address is used to address a word line for refreshing the memory block corresponding to the word line. When the address decoder and selector 104 does not receive the refresh instruction, the address decoder and selector 104 decodes the access instruction to address the word lines of the memory array 110 (i.e. the address decoder and selector 104 decodes the access instruction to select the word lines of the memory array 110). Then the memory controller 100 performs the access instruction to access the memory array 110.

When the address decoder and selector 104 receives the refresh instruction, the address decoder and selector 104 stops decoding the access instruction and decodes the refresh instruction to address the word lines of the memory array 110 (i.e. the address decoder and selector 104 decodes the access instruction to select the refreshed word line). Therefore the memory controller 100 can sequentially refresh each of the memory blocks corresponding to each of the word lines according to the refresh address or refresh the memory block corresponding to the word line which is adjacent to the accessed word line.

Figure 1B:
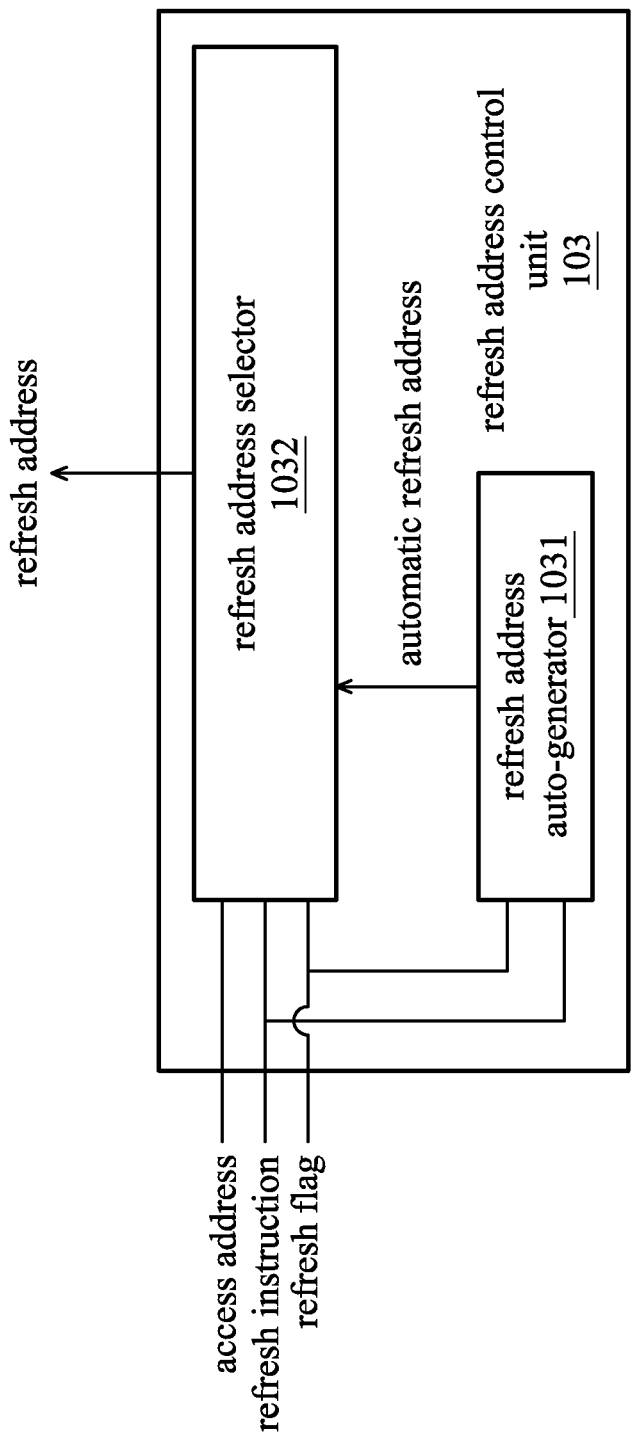
FIG. 1B shows a block diagram of a refresh address control unit 103 according to the second embodiment of the present disclosure.

FIG. 1B shows a block diagram of the refresh address control unit 103 according to the second embodiment of the present disclosure. In the second embodiment, the refresh address control unit 103 comprises a refresh address auto-generator 1031 and a refresh address selector 1032. The refresh address auto-generator 1031 receives the refresh instruction and the refresh flag. Then the refresh address auto-generator 1031 outputs the automatic refresh address to the refresh address selector 1032 according to the refresh instruction and the refresh flag. The refresh address selector 1032 receives the access address, the refresh instruction, the refresh flag and the automatic refresh address. In the second embodiment, when the refresh address auto-generator 1031 only receives the refresh instruction, the refresh address auto-generator 1031 outputs the automatic refresh address to the refresh address selector 1032. The refresh address auto-generator 1031 comprises a counter (not shown in FIG. 1B) used to accumulate the automatic refresh address and thus each of the automatic refresh addresses sequentially corresponds to each of the word lines of the memory array 110. At this time, the refresh address selector 1032 does not receive the refresh flag and selects the automatic refresh address as the refresh address. Therefore the refresh address received by the address decoder and selector 104 is the automatic refresh address. Then the memory controller 100 sequentially refreshes each of the memory blocks of the memory array 110 according to the automatic refresh address. Through the above method, the automatic refresh address generated by the refresh address auto-generator 1031 can sequentially address each of the word lines. However the present disclosure is not limited thereto. Any of the methods for sequentially refreshing each of the memory blocks of the memory array 110 is not outside the scope of the present disclosure.

In the second embodiment, the refresh address auto-generator 1031 stops generating the automatic refresh address when the refresh address auto-generator 1031 receives both the refresh flag and the refresh instruction. At this time, the refresh address selector 1032 selects the address adjacent to the access address as the refresh address due to receiving the refresh flag. Therefore the refresh address received by the address decoder and selector 104 is the address adjacent to the access address. Then, according to the address adjacent to the access address, the memory controller 100 refreshes the memory block of the word line which is adjacent to the word line currently being accessed by the memory controller 100. Hence the second embodiment of the present disclosure uses the refresh flag to refresh the memory block of the word line (i.e. the victim word line) adjacent to the word line currently being accessed. After the memory controller 100 refreshes the memory block of the victim word line, the refresh address selector 1032 again selects the automatic refresh address as the refresh address because it has not received the refresh flag. Then the memory controller 100 sequentially proceeds to refresh each of the memory blocks of the memory array 110 according to the automatic refresh address.

Additionally, it is noticeable that the predetermined value in the counting unit 102 does not have to be a fixed number; it may be a random number. The counting unit 102 can select the random number generated by the random generator 105 to replace the predetermined value; but the present disclosure is not limited thereto. Additionally, more than one victim word line probably exists. That is because, in some cases, two or more word lines are disturbed while the memory controller 100 accesses the memory array 110. In these cases, the refresh address selector 1032 selects a plurality of addresses adjacent to the access address as a plurality of refresh addresses. Then, according to the plurality of refresh addresses, the memory controller 100 refreshes the corresponding memory blocks of the plurality of victim word lines.

A third embodiment of the present disclosure illustrates how the memory circuit 10 solves the row hammer problem. In the third embodiment, the duty cycle of the memory circuit 10 is 80 μs; each of the word lines in the memory circuit 10 is refreshed every 32 ms; the predetermined value in the counting unit 102 is $5*10^4$; and the row hammer probably occurs while the word line of the memory circuit 10 has been disturbed more than $2*10^5$ times. If a word line $WL_n$ in the memory circuit 10 has been incessantly accessed every 32 ms, then the victim word line $WL_{(n-1)}$ (or $WL_{n+1}$) which is adjacent to the word line $WL_n$ has been disturbed $4*10^5$ times (32 ms/80 μs). Obviously, this can lead to row hammer occurring on the victim word line $WL_{(n-1)}$ if the victim word line $WL_{(n-1)}$ has not been refreshed by the memory controller 100 in 32 ms. Because the predetermined value in the counting unit 102 is $5*10^4$, the counting unit 102 outputs the refresh flag to the refresh control unit 103 when the victim word line $WL_{(n-1)}$ has been cumulatively disturbed $5*10^4$ times (i.e. when the word line $WL_n$ has been cumulatively accessed $5*10^4$, $1*10^5$, $1.5*10^5$, $2*10^5$, $2.5*10^5$, $3*10^5$, $3.5*10^5$ or $4*10^5$ times). Then the refresh control unit 103 selects the address adjacent to the access address of the word line $WL_n$ as the refresh address, and the memory controller 100 refreshes the corresponding memory block of the victim word line $WL_{(n-1)}$ according to the refresh address. Through the above method, the row hammer will not occur on the victim word line $WL_{(n-1)}$ because the number of cumulative disturbances of the victim word line $WL_{(n-1)}$ is less than $2*10^5$.

A fourth embodiment of the present disclosure illustrates how the memory circuit 10 solves the problem of row hammer. In the fourth embodiment, the duty cycle of the memory circuit 10 is 80 μs; each of the word lines in the memory circuit 10 is refreshed every 32 ms; the predetermined value in the counting unit 102 is $5*10^4$; and row hammer is likely to occur when the word line of the memory circuit 10 has been disturbed more than $2*10^5$ times. In the fourth embodiment, the memory controller 100 incessantly accesses the word line $WL_n$ 4.9999*10$^4$ times. Then the memory controller 100 accesses a word line $WL_8$ at the 5*10$^4$-th accessing. Then the refresh control unit 103 selects the address adjacent to the access address of the word line $WL_8$ as the refresh address, and the memory controller 100 refreshes the corresponding memory block of the victim word line $WL_7$ according to the refresh address. The same procedure is repeated. The word line $WL_n$ misses the 5*10$^4$-th, the 1*10$^5$-th, the 1.5*10$^5$-th, the 2*10$^5$-th, the 2.5*10$^5$-th, the 3*10$^5$-th, the 3.5*10$^5$-th and the 4*10$^5$-th accessing so that the word line $WL_n$ needs to wait 32 ms to refresh. However, the cumulative disturbance number (4*10$^5$−8) of the victim word line $WL_{(n-1)}$ is larger than 2*10$^5$. This can lead row hammer to occur on the victim word line $WL_{(n-1)}$. That is because the victim word line $WL_{(n-1)}$ regularly misses the refresh flag.

In order to solve the above problem, a random number generated by the random generator 105 is used to replace the original predetermined value (2*10$^5$) in the counting unit 102. For example, if the random number generated by the random generator 105 is 4.5*10$^4$, then the memory controller 100 refreshes the corresponding memory block of the victim word line $WL_{(n-1)}$ during the 4.5*10$^4$-th accessing. Because the predetermined value stored in the counting unit 102 is not a regular number, the memory controller 100 can avoid the situation of regularly missing the refresh flag.

Figure 2:
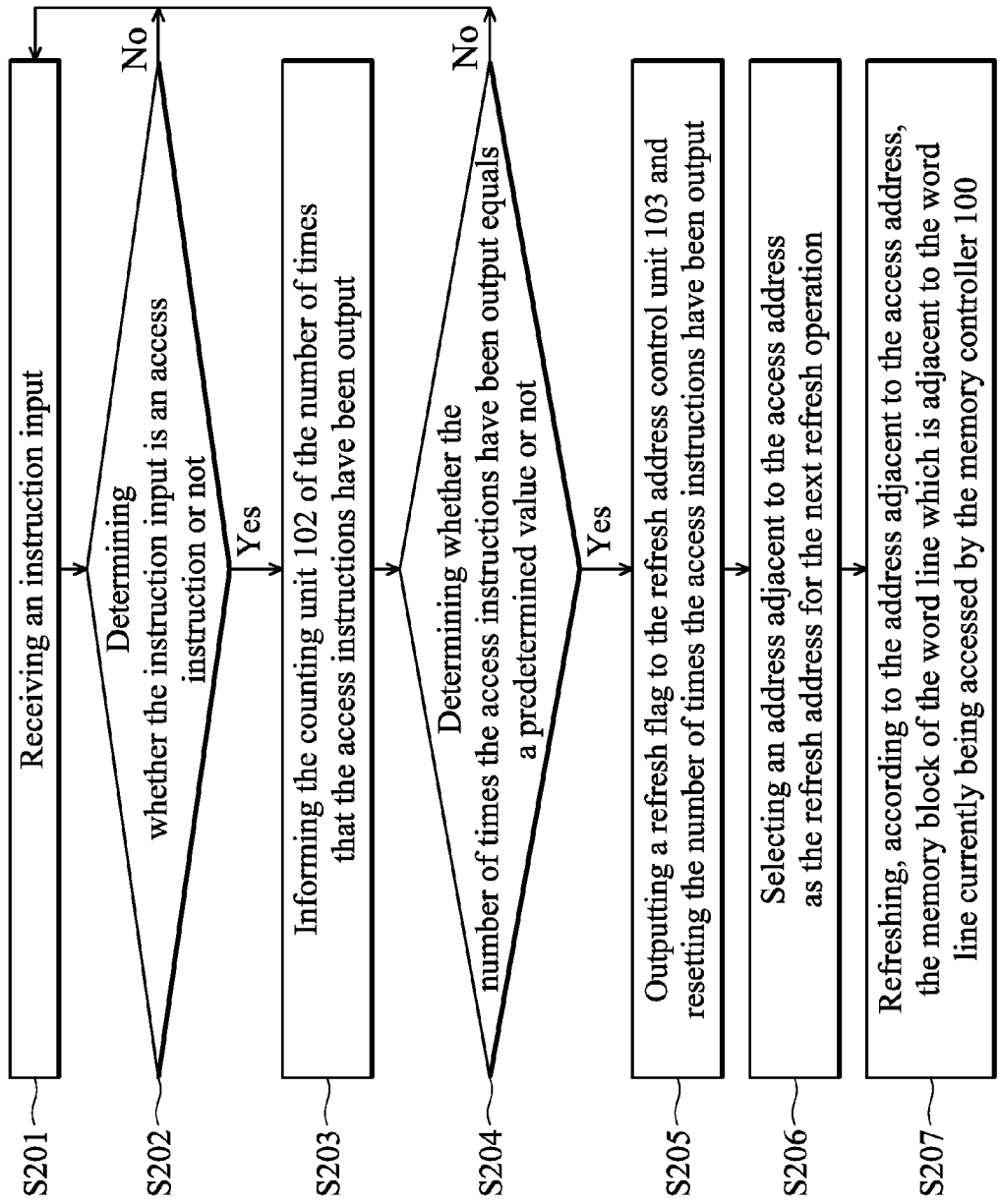
FIG. 2 shows a flow diagram of the refresh method according to an embodiment of the present disclosure.

FIG. 2 shows a flow diagram of the refresh method according to an embodiment of the present disclosure. In step S201, the instruction decoder 101 receives an instruction input. In step S202, the instruction decoder 101 determines whether the instruction input is an access instruction or not. If the instruction input is an access instruction, the method proceeds to step S203. Otherwise, the method goes back to step S201. In step S203, the instruction decoder 101 informs the counting unit 102 of the number of times that the access instructions have been output, and the method proceeds to step S204. In step S204, the counting unit 102 determines whether the number of times the access instructions have been output equals a predetermined value or not. If the number of times the access instructions have been output equals the predetermined value, then the method proceeds to step S205. Otherwise, the method goes back to step S201. In step S205, the counting unit 102 outputs a refresh flag to the refresh address control unit 103 and resets the number of times the access instructions have been output, and then the method proceeds to step S206. In step S206, the refresh address control unit 103 selects an address adjacent to the access address as the refresh address for the next refresh operation. Finally, according to the address adjacent to the access address, the memory controller 100 refreshes the memory block of the word line which is adjacent to the word line currently being accessed by the memory controller 100 in step S207. Then the memory controller 100 sequentially proceeds to refresh each of the memory blocks of the memory array 110 according to an automatic refresh address generated internally.

While the present disclosure has been described by way of example and in terms of preferred embodiment, it should be understood that the present disclosure is not limited thereto. On the contrary, it is intended to cover various modifications and similar arrangements (as would be apparent to a person skilled in the art). Therefore, the scope of the appended claims should be accorded the broadest interpretation so as to encompass all such modifications and similar arrangements.

What is claimed is:

1. A memory circuit, comprising:
   a memory array having a plurality of memory blocks;
   a plurality of word lines disposed to correspond to the memory blocks; and
   a memory controller, outputting an access instruction and an access address to address the word lines for accessing the memory array, or outputting a refresh instruction and a refresh address to address the word lines for refreshing the memory array, wherein the memory controller performs a refresh operation on each of the memory blocks corresponding to each of the word lines at predetermined intervals; wherein the memory controller counts the number of times the access instructions have been output and determines whether the number equals a predetermined value or not; and wherein according to the determination result, the memory controller selects an address adjacent to the access address as the refresh address for the next refresh operation;
   a counting unit, counting the number of times the access instructions have been output, wherein the counting unit outputs a refresh flag and resets the number of times the access instructions have been output when the number of times the access instructions have been output equals the predetermined value;
   an instruction decoder coupled to the counting unit, receiving an instruction input, determining whether the instruction input is the access instruction or the refresh instruction, and outputting the access instruction or the refresh instruction; wherein if the instruction input is the access instruction, the instruction decoder informs the counting unit accumulating the number of times the access instructions have been output;
   a refresh address control unit coupled to the counting unit, receiving an access address, the refresh flag and the refresh instruction, and outputting the refresh address; and
   an address decoder and selector coupled to the refresh address control unit, receiving the access address, the refresh instruction and the refresh address, and addressing the word lines of the memory array according to the access address or the refresh address,
   wherein when the address decoder and selector does not receive the refresh instruction, the address decoder and selector decodes the access address to address the word lines of the memory array, and
   wherein when the address decoder and selector receive the refresh instruction, the address decoder and selector stop decoding the access address and address the word lines of the memory array according to the refresh address.

2. The memory circuit of claim 1, wherein the memory controller further comprises:
   a random generator coupled to the counting unit, generating a random value to refresh the predetermined value.

3. The memory circuit of claim 1, wherein the refresh address control unit selects an automatic refresh address generated internally as the refresh address; and
   wherein when the refresh address control unit receives the refresh flag, the refresh address control unit selects the address adjacent to the access address as the refresh address for the next refresh operation instead of selecting the automatic refresh address as the refresh address.

4. The memory circuit of claim 3, wherein the refresh address control unit further comprises:

a refresh address auto-generator, generating the automatic refresh address according to the received refresh instruction, wherein when the refresh address auto-generator receives the refresh flag, the refresh address auto-generator stops generating the automatic refresh address; and a refresh address selector, receiving the access address, the refresh instruction, the refresh flag and the automatic refresh address, and selecting the automatic refresh address as the refresh address, wherein when the refresh address selector receives the refresh flag, the refresh address selector selects the address adjacent to the access address as the refresh address for the next refresh operation.

5. A memory circuit refresh method for refreshing a plurality of memory blocks of a memory array, each of the memory blocks has a corresponding word line, the refresh method comprising:

receiving an instruction input;

determining whether the instruction input is an access instruction or a refresh instruction;

outputting the access instruction and an access address to address the word lines for accessing the memory array, or outputting a refresh instruction and a refresh address to address the word lines for refreshing each of the memory blocks corresponding to each of the word lines;

counting the number of times the access instructions have been output and determining whether the number equals a predetermined value or not;

determining, according to the determination result, whether to select an address adjacent to the access address as the refresh address for the next refresh operation or not;

selecting an automatic refresh address generated internally as the refresh address when the number of times the access instructions have been output is not equal to a predetermined value;

outputting a refresh flag, resetting the number of times the access instructions have been output, and selecting the address adjacent to the access address as the refresh address when the number of times the access instructions have been output equals a predetermined value;

receiving, by a refresh address control unit, the access address, the refresh flag and the refresh instruction;

outputting a refresh address by the refresh address control unit;

receiving, by an address decoder and selector, the address input, the refresh instruction and the refresh address; and addressing, by the address decoder and selector, the word lines of the memory array according to the access address or the refresh address, wherein when the address decoder and selector does not receive the refresh instruction, the address decoder and selector decodes the access address to address the word lines of the memory array, and wherein when the address decoder and selector receive the refresh instruction, the address decoder and selector stop decoding the access address and address the word lines of the memory array according to the refresh address.

6. The refresh method of claim 5, further comprising:

generating, by a random generator, a random value to refresh the predetermined value.

7. The refresh method of claim 5, further comprising:

generating, by a refresh address auto-generator, the automatic refresh address according to the received refresh instruction, wherein when the refresh address auto-generator receives the refresh flag, the refresh address auto-generator stops generating the automatic refresh address;

receiving, by a refresh address selector, the access address, the refresh instruction, the refresh flag and the automatic refresh address; and selecting, by the refresh address selector, the automatic refresh address as the refresh address, wherein when the refresh address selector receives the refresh flag, the refresh address selector selects the address adjacent to the access address as the refresh address for the next refresh operation.

* * * * *